United States Patent
Kremin

(10) Patent No.: US 8,436,263 B2
(45) Date of Patent: May 7, 2013

(54) NOISE RESISTANT CAPACITIVE SENSOR

(75) Inventor: Viktor Kremin, Lviv (UA)

(73) Assignee: Cypress Semiconductor Corporation, San Jose, CA (US)

( * ) Notice: Subject to any disclaimer, the term of this patent is extended or adjusted under 35 U.S.C. 154(b) by 1712 days.

(21) Appl. No.: 11/824,249

(22) Filed: Jun. 29, 2007

(65) Prior Publication Data

US 2009/0002206 A1 Jan. 1, 2009

(51) Int. Cl.
*G06F 3/041* (2006.01)
*G06F 3/044* (2006.01)
*G08C 21/00* (2006.01)

(52) U.S. Cl.
USPC ...................................... 178/18.06; 345/173

(58) Field of Classification Search .................. 345/173; 178/18.01–18.11; 341/15
See application file for complete search history.

(56) References Cited

U.S. PATENT DOCUMENTS

| | | | | |
|---|---|---|---|---|
| 5,949,264 A | * | 9/1999 | Lo | 327/157 |
| 6,140,853 A | * | 10/2000 | Lo | 327/157 |
| 6,400,217 B1 | * | 6/2002 | Bhandari | 327/554 |
| 7,129,714 B2 | * | 10/2006 | Baxter | 324/678 |
| 7,598,752 B2 | * | 10/2009 | Li | 324/657 |
| 7,667,468 B1 | * | 2/2010 | Anderson | 324/676 |
| 2003/0112021 A1 | * | 6/2003 | Palata et al. | 324/658 |

* cited by examiner

*Primary Examiner* — Srilakshmi K Kumar

(57) ABSTRACT

A switch capacitor unit for implementing a capacitive sensor includes a charging switch, a charge transfer switch, and a first switch. The charging switch is coupled between a first supply voltage and a circuit node to selectively couple a sensing capacitor to the first supply voltage through the circuit node. The charge transfer switch is coupled between the circuit node and a first terminal of a second capacitor to selectively couple the sensing capacitor through the circuit node to the second capacitor. The first switch is coupled between the circuit node and a second terminal of the second capacitor to selectively couple the second terminal to the sensing capacitor through the circuit node.

32 Claims, 10 Drawing Sheets

CONVERSION UNITS

NOISE RESISTANT CAPACITIVE SENSOR

TECHNICAL FIELD

This disclosure relates generally to electronic circuits, and in particular but not exclusively, relates to capacitive sensor circuits.

BACKGROUND INFORMATION

Capacitance sensors are used to implement a variety of useful functions including touch sensors (e.g., touch pad, touch dial, touch wheel, etc.), determining the presence of an object, accelerometers, and other functions. In general, capacitive sensors are intended to replace mechanical buttons, knobs, and other similar mechanical user interface controls. A capacitive sensor permits eliminating complicated mechanical switches and buttons, providing reliable operation under harsh conditions. Capacitive sensors are widely used in the modern consumer applications, providing new user interface options in existing products (cell phones, digital music players, personal digital assistances, etc.).

One class of capacitive sensor uses a charge transfer technique. Referring to FIG. 1, the charge transfer technique charges a sensing capacitor Cx in one phase (switch SW1 closed, switch SW2 open) and discharges the sensing capacitor Cx into a summing capacitor Csum in a second phase (SW1 open, SW2 closed). Switches SW1 and SW2 are operated in a manner to repeatedly transfer charge from Cx to Csum.

Capacitance sensor 100 is operated to measure the capacitance of Cx in the following manner. In an initial stage, Csum is reset by discharging charge on Csum by temporarily closing switch SW3. Then, switches SW1 and SW2 commence operating in two phases that charge Cx and transfer the charge from Cx into Csum. The voltage potential on Csum rises with each charge transfer phase, as illustrated in FIG. 1B. The capacitance of Cx is determined by measuring the number of cycles (or time) required to raise Csum to a predetermined voltage potential. Alternatively, the capacitance of Cx can be determined by measuring the voltage on Csum after executing a predetermined number of charge transfer cycles.

Relative to other capacitive sensing techniques, the charge transfer method has relatively low sensitivity to RF fields and RF noise. This relative noise immunity stems from the fact that the sensing capacitor is typically charged by a low-impedance voltage source and the charge is transferred to a low-impedance accumulator (i.e., the summing capacitor Csum). However, the charge transfer technique is still susceptible to RF noise due to potential RF signal rectification by electrostatic discharge ("ESD") protection circuits inside an integrated circuit ("IC") implementation. Furthermore, capacitance sensor 100 is sensitive to DC currents (e.g. leakage) on sensing capacitor Cx. These DC current may arise from printed circuit board ("PCB") or sensor assembly leakage problems, high power UHF signals (e.g., cell phones, microwave ovens, etc.), or rectification by on-chip electrostatic discharge ("ESD") protection diodes. Additionally, the charge transfer mechanism is susceptible to noise having a frequency matching (or harmonics thereof) the switching frequency of switches SW1 and SW2 due to an aliasing phenomenon.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of an apparatus and method for a noise resistant capacitive sensor are described herein. In the following description numerous specific details are set forth to provide a thorough understanding of the embodiments. One skilled in the relevant art will recognize, however, that the techniques described herein can be practice without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1A:
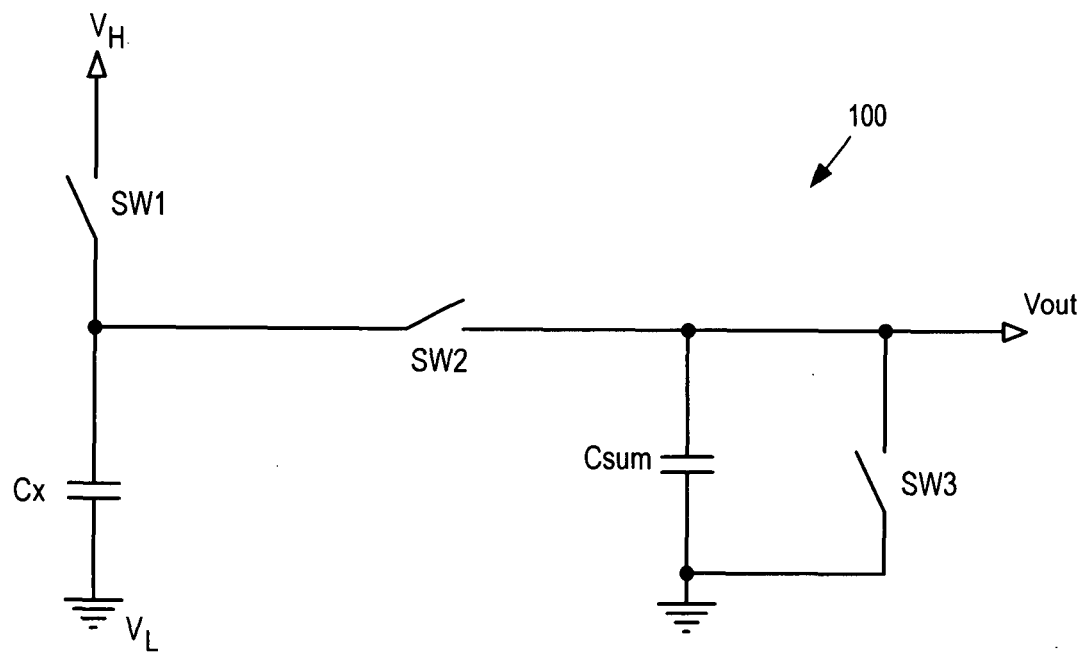
FIG. 1A is a circuit diagram illustrating a conventional capacitance sensor circuit.
Figure 1B:
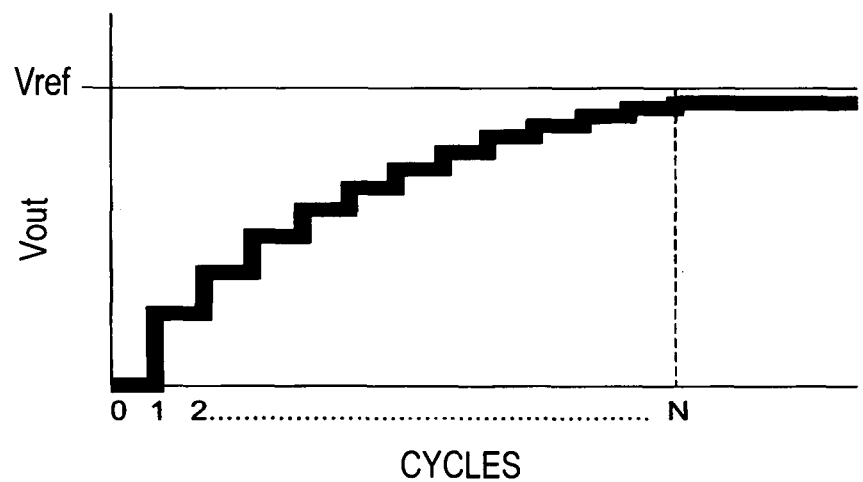
FIG. 1B is a graph illustrating the exponential relationship between voltage on a summing capacitor and charge transfer cycles.
Figure 2:
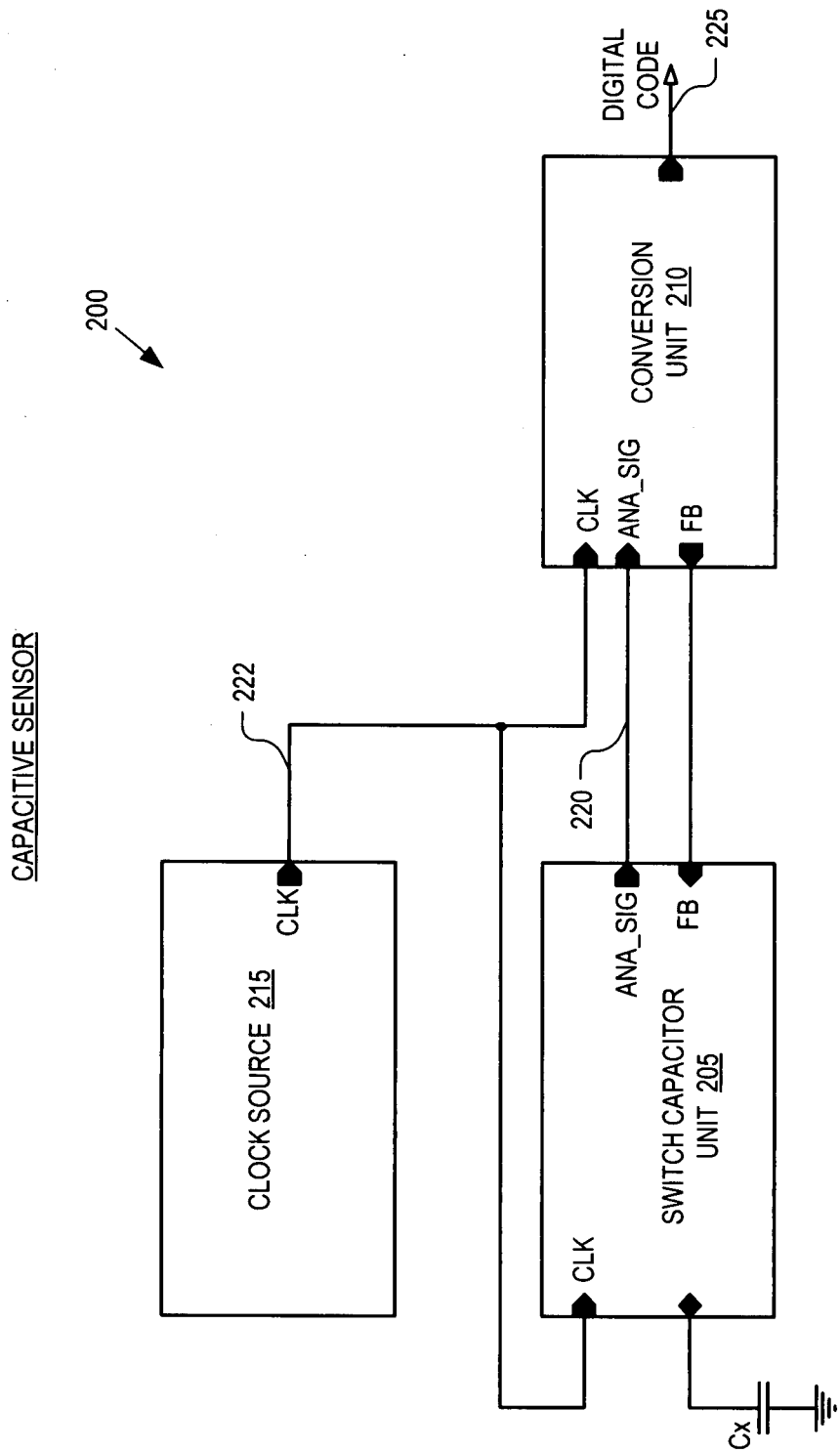
FIG. 2 is a functional top-level block diagram illustrating a capacitive sensor, in accordance with an embodiment of the invention.

FIG. 2 is a functional block diagram illustrating a capacitive sensor 200, in accordance with an embodiment of the invention. The illustrated embodiment of capacitive sensor 200 includes a switch capacitor unit 205, a conversion unit 210, and a clock source 215.

Switch capacitor unit 205 forms the front end of capacitive sensor 200, which reciprocally charges an externally coupled sensing capacitor (Cx) and then discharges Cx by transferring its charge to an internal integrating capacitor (Cint). This form of capacitive sensing is commonly referred to as charge transfer capacitive sensing. Switching capacitor unit 205 generates an analog signal 220 that is indicative or otherwise related to the capacitance or capacitance change of Cx. In one embodiment, analog signal 220 is an analog voltage. Switch capacitor unit 205 provides the analog signal 220 to conversion unit 210. Conversion unit 210 forms the backend of capacitive sensor 200 and converts analog signal 220 into a digital code 225 that may subsequently be filtered or otherwise manipulated by software. Switching capacitor unit 205 and conversion unit 210 are both clocked by clock source 215. In one embodiment, clock source 215 is a spread-spectrum clock source to provide greater noise immunity from external noise sources having similar frequencies or harmonics thereof. In some embodiments, clock source 215 can generate one clock signal for switch capacitor unit 205 and a different clock signal for conversion unit 210. For example, a spread spectrum clock may be provided to switch capacitor unit 205 while a fixed-frequency signal may be supplied to conversion unit 210.

In one embodiment, capacitive sensor 200 may be used to implement the control circuitry of a capacitive sense user interface, where sense capacitor Cx represents a single physical capacitive element of the capacitive sense user interface. When a user bring his finger or other conductive object, into proximity with Cx, the capacitance of Cx is changed causing a corresponding change in analog signal 220 and digital code 225. Software algorithms may be applied to digital code 225 to register actuation events of Cx or reject false actuations. Capacitive sensor 200 may be used to implement capacitive sense user interfaces in a variety of products including personal digital assistants ("PDAs"), laptop computers, cellular phones, various consumer electronic devices, white goods, music players, or otherwise.

Figure 3:
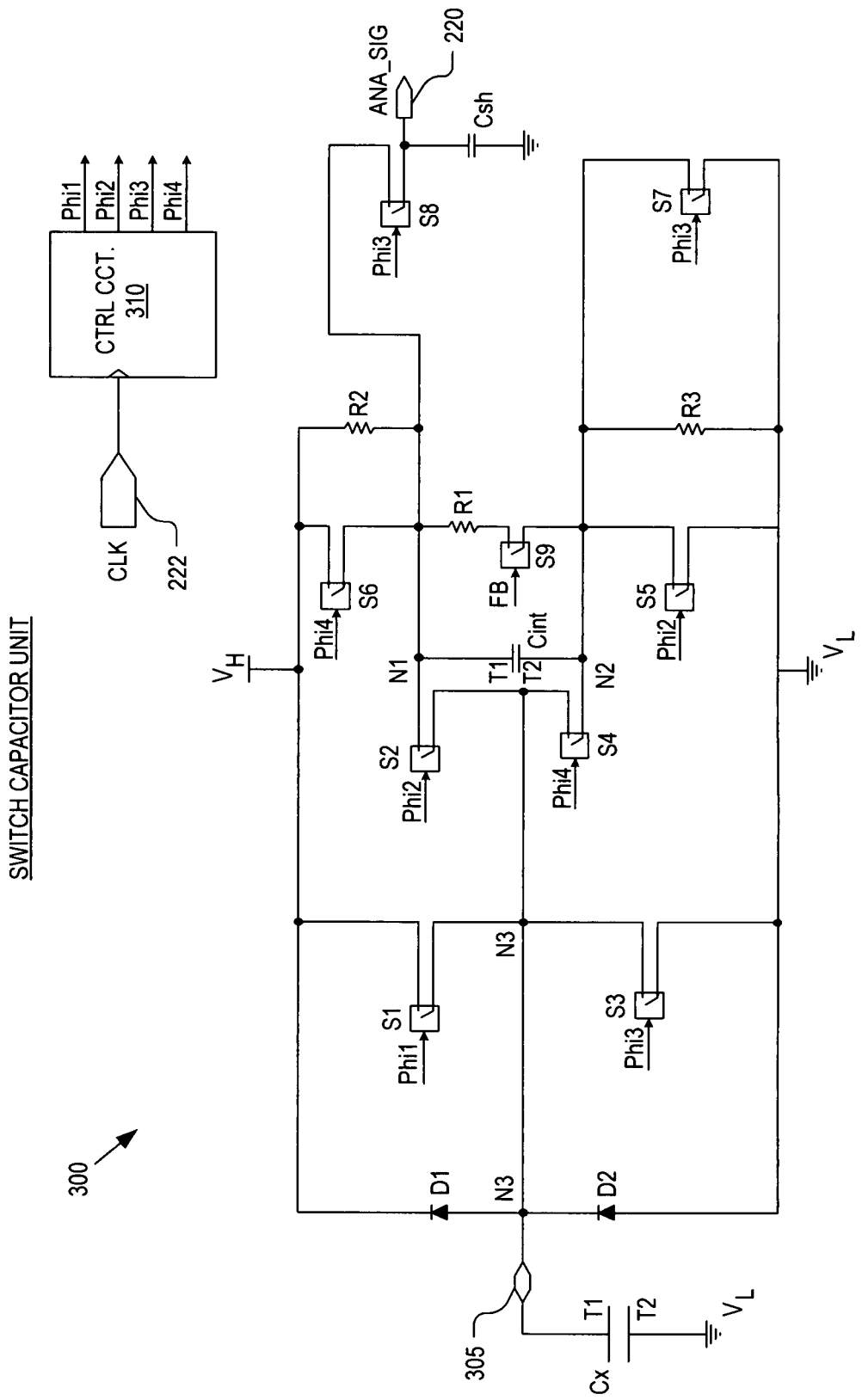
FIG. 3 is a circuit diagram illustrating a switch capacitor unit, in accordance with an embodiment of the invention.

FIG. 3 is a circuit diagram illustrating a switch capacitor unit 300, in accordance with an embodiment of the invention. Switch capacitor unit 300 represents one possible embodiment of switch capacitor unit 205. The illustrated embodiment of switch capacitor unit 300 includes switches S1 through S9, integrating capacitor (Cint), sample and hold capacitor (Csh), resistors R1, R2, and R3, diodes D1 and D2, input/output ("I/O") port 305, and control circuit 310. It should be appreciated that various components illustrated in FIG. 3 may be considered optional (e.g., diodes D1 and D2).

During operation, switch S1 operates as a charging switch S1 to charge Cx to the high supply voltage ($V_H$), switch S3 operates as a discharging switch S3 to discharge Cx to the low supply voltage ($V_L$) (e.g., ground), switch S2 operates as a charge transfer switch S2 to transfer charge between Cx and Cint through node N1, and switch S4 operates to reverse couple terminals or electrodes of Cx and Cint to cancel noise between cycles of operation of switch capacitor unit 300 (discussed in detail below). All four switches S1, S2, S3, and S4 couple to terminal T1 of sensing capacitor Cx through I/O port 305 and node N3. Switch S9 operates as a discharge switch for coupling terminals T1 and T2 of Cint together through resistance R1. Closing switch S9 discharges integrating capacitor Cint via resistor R1. In one embodiment, discharge switch S9 is responsive to a feedback signal FB output by conversion unit 210. Alternatively, resistor R1 and switch S9 may be replaced with a current sink/source to discharge Cint. The current sink/source would be coupled to turn on/off in response to feedback signal FB. Sample and hold capacitor Csh operates to sample the voltage on Cint via sample switch S8. Resistors R2 and R3 are large value pull up and pull down resistors (e.g., mega-ohms) to pull the terminals of Cint when they are not otherwise connected to a charge source or load. Resistors R2 and R3 may be included to prevent analog MOSFET switch leakage current when any integration capacitor pin potential exceeds supply voltage $V_H$ or drops below $V_L$. Diodes D1 and D2 provide electrostatic discharge ("ESD") protection for I/O port 305.

Figure 4:
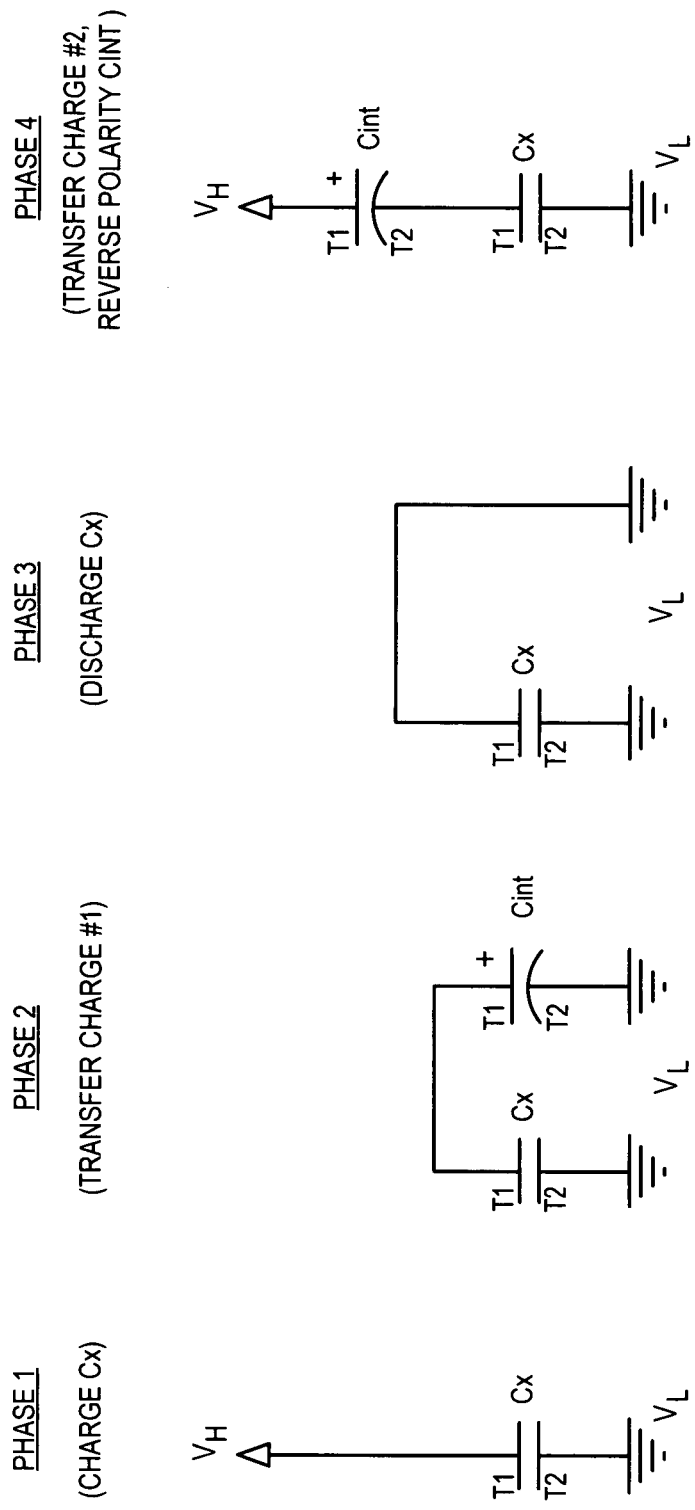
FIG. 4 is a diagram illustrating four phases of operation of a switch capacitor unit, in accordance with an embodiment of the invention.

FIG. 4 is a diagram illustrating four phases of operation of switch capacitor unit 300 (or 205), in accordance with an embodiment of the invention. In one embodiment, during operation of switch capacitor unit 300, four configuration phases are cycled through to perform capacitive sensing. The four phases include: charging Cx (phase 1), transferring charge between Cx and Cint (phase 2), discharging Cx (phase 3), and transferring charge between Cx and Cint again (phase 4). The polarity of Cint is reverse coupled between charge transfer phase 2 and phase 4. Accordingly, phase 4 may also be referred to as a reverse coupling phase.

In the illustrated embodiment, during phase 1 sensing capacitor Cx is charged by coupling its terminal T1 to $V_H$. During phase 2, terminals T1 of both Cx and Cint are coupled together to transfer charge accumulated on Cx during phase 1 onto Cint. Voltage on Cint is increased by a charge amount, which is moved from Cx to Cint. During phase 3, Cx is discharged by coupling both its terminals to $V_L$. Also during phase 3, sample and hold capacitor Csh samples Cint while Cx is discharging (not illustrated). Finally, in phase 4 Cint is reverse coupled to Cx by coupling terminal T2 of Cint to terminal T1 of Cx. During phase 4, Cint is charged further with charge that is passed from the discharged Cx. It is noteworthy that at charge transfer phases 2 and 4, the polarity of Cint is reversed, so the parasitic charge that is accumulated in phase 2 is compensated in phase 4. In embodiments where clock source 215 is a spread spectrum clock, noise is mixed to higher frequencies and filtered by the effective low-pass filter formed by Cint and the equivalent switching capacitor resistance.

Figure 5:
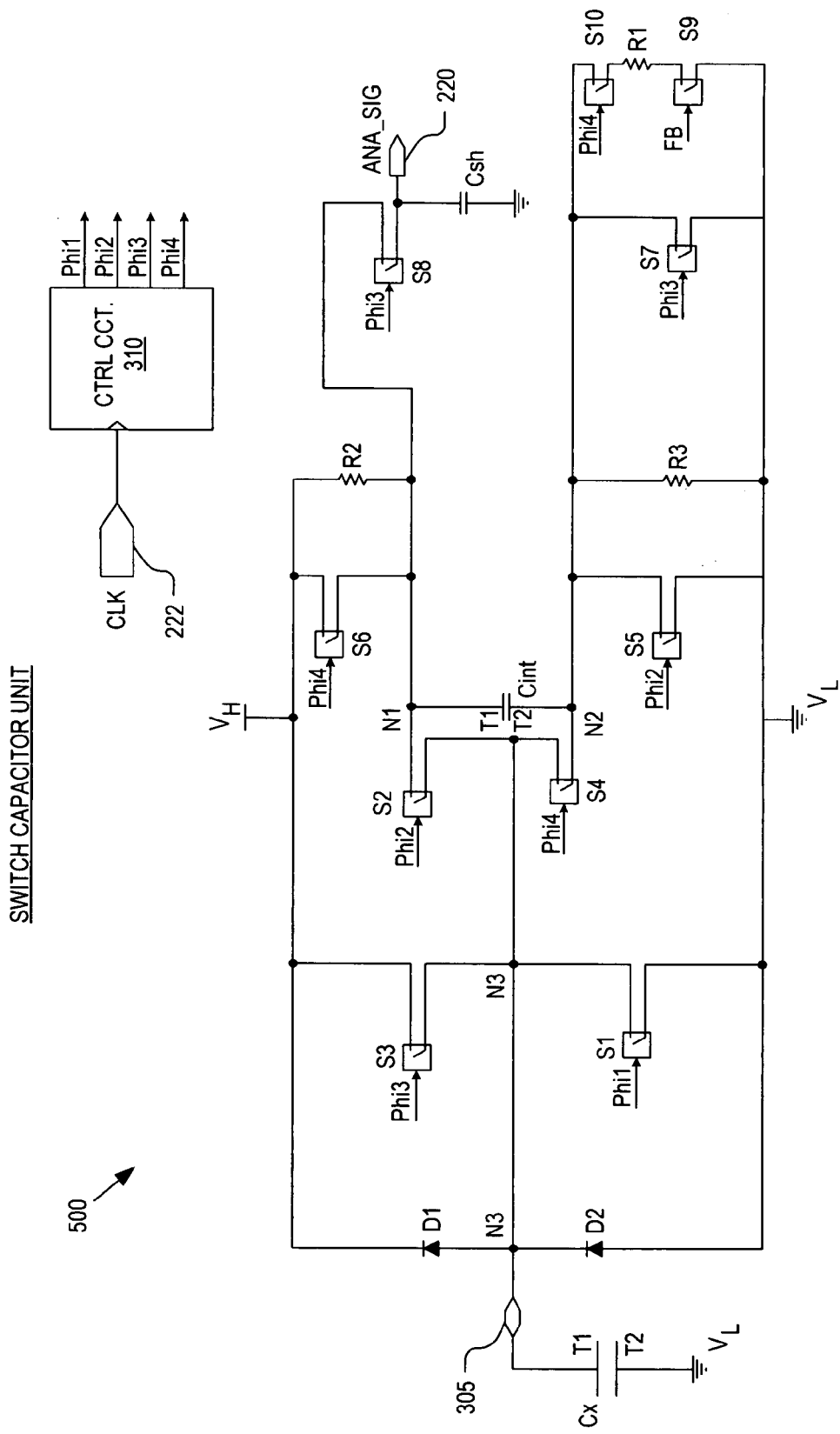
FIG. 5 is a circuit diagram illustrating a switch capacitor unit, in accordance with an embodiment of the invention.
Figure 6:
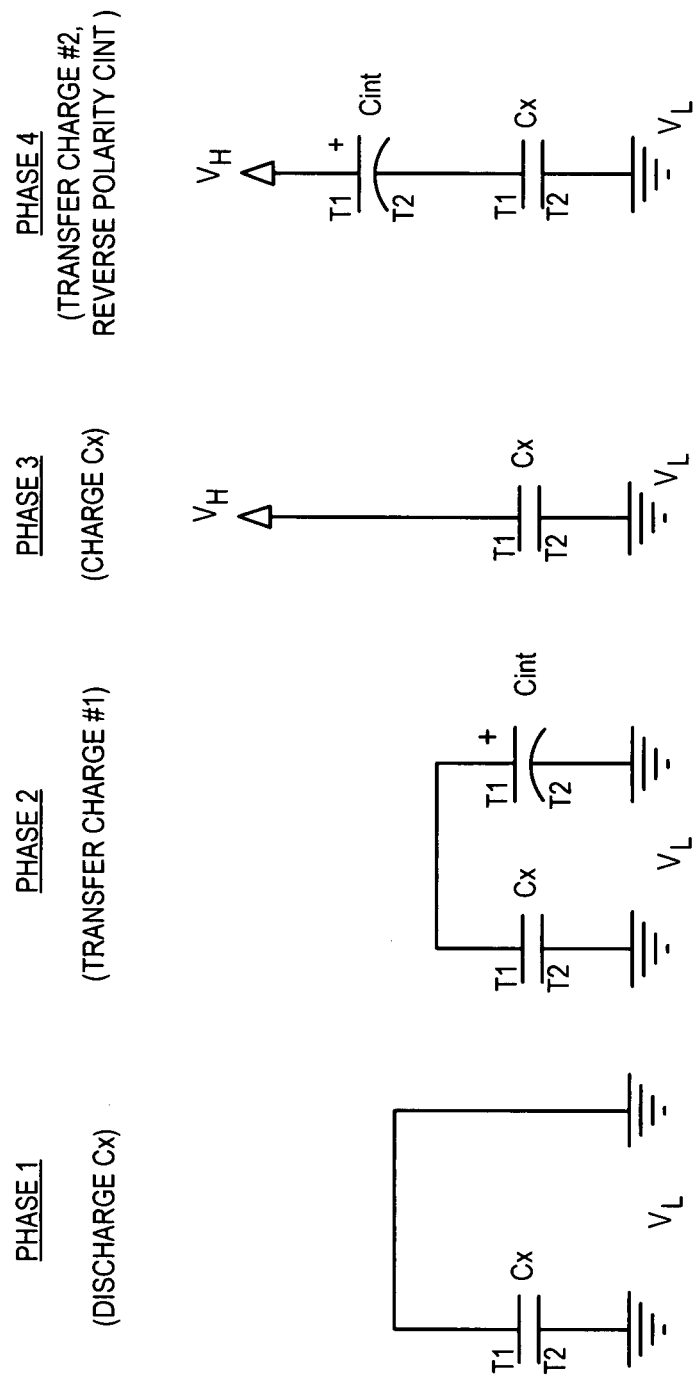
FIG. 6 is a diagram illustrating four phases of operation of a switch capacitor unit, in accordance with an embodiment of the invention.

It should be appreciated that FIG. 4 illustrates a positive charge transfer example, while embodiments of the invention may also be implemented with negative charge transfer by discharge Cint during charge transfer phases 2 and 4. Accordingly, the phrase "charge transfer" is defined herein to refer to both positive charge transfer and negative charge transfer unless otherwise indicated expressly or inherently. FIG. 5 illustrates a switch capacitor unit 500 for implementing a negative charge transfer scheme, in accordance with an embodiment of the invention. In comparison to the FIG. 3, switches S1 and S3 are exchanged to discharge sensing capacitor Cx to $V_L$ during phase 1 and charge Cx to $V_H$ during phase 3. Feedback from conversion unit 210 is modified to provide charge to Cint via R1 and switches S9 and S10 during a logic high of feedback signal FB. Other embodiments for charging circuits are possible as well. The operational phases for switch capacitor unit 500 are illustrated at FIG. 6.

Figure 7:
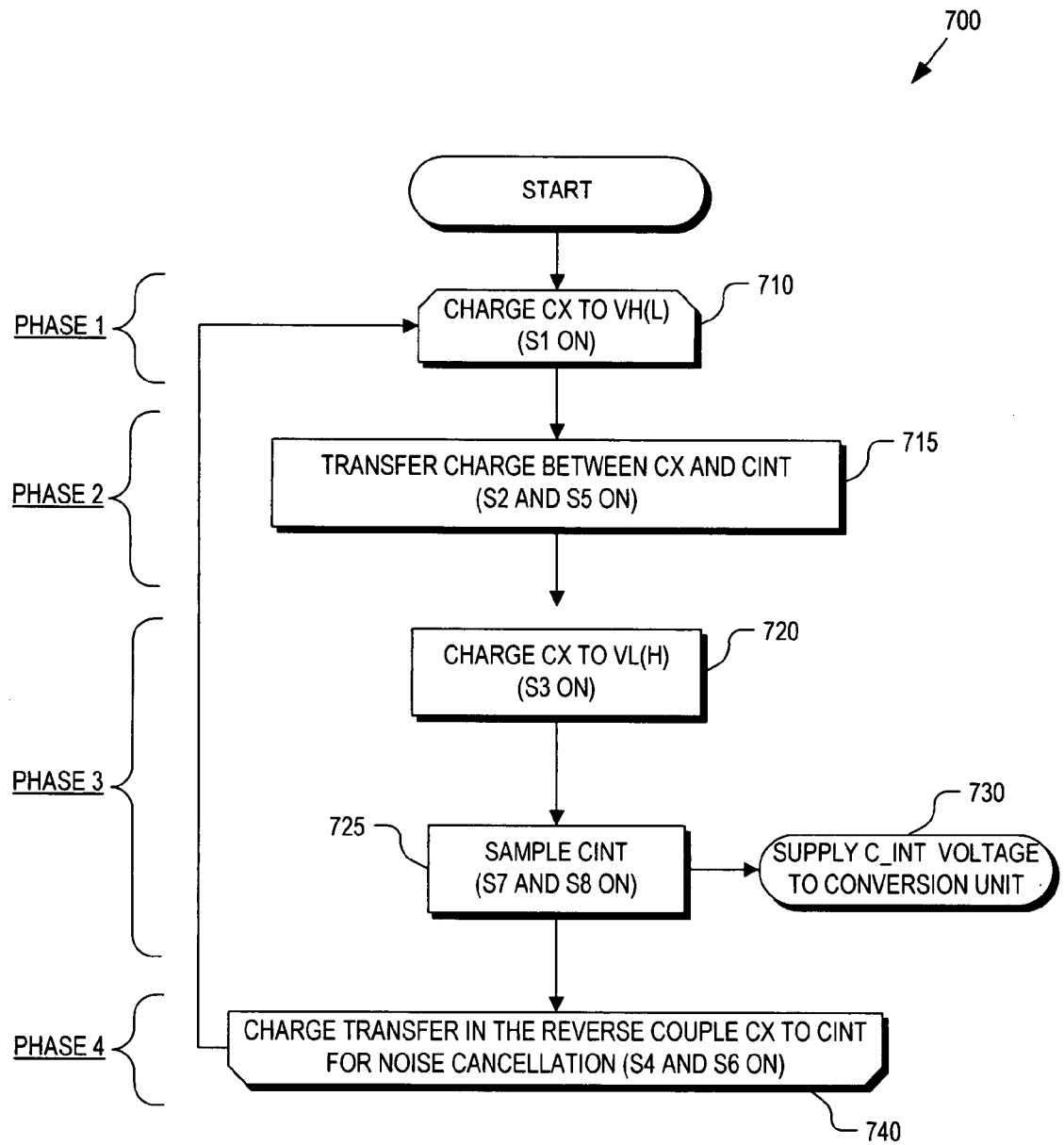
FIG. 7 is a flow chart illustrating a process of operating a capacitive sensor, in accordance with an embodiment of the invention.

FIG. 7 is a flow chart illustrating a process 700 of operating capacitive sensor 200, in accordance with an embodiment of the invention for both positive and negative charge transfer schemes. The order in which some or all of the process blocks appear in each process should not be deemed limiting. Rather, one of ordinary skill in the art having the benefit of the present disclosure will understand that some of the process blocks may be executed in a variety of orders not illustrated, or even in parallel.

In a process block 710 (phase 1), sensing capacitor Cx is charged to $V_H$ for a positive charge transfer scheme and to $V_L$ for a negative charge transfer scheme by temporarily close circuiting charging switch S1 in response to control signal Phi1. In a process block 715 (phase 2), the charge on Cx is transferred into terminal T1 of Cint through nodes N3 and N1. The charge transfer between Cx and Cint is initiated by close circuiting charge transfer switch S2 and switch S5 in response to control signal Phi2. Closing circuiting switch S5 places terminals T2 of both Cx and Cint at the same voltage potential $V_L$ (e.g., ground) to promote charge transfer. Upon completion of phase 2, switches S2 and S5 are open circuited.

In a process block 720 (phase 3), sensing capacitor Cx is discharged to $V_L$ for the positive charge transfer scheme or charged to $V_H$ for the negative charge transfer scheme. In the illustrated embodiment, Cx is connected by S3 in response to control signal Phi3 to couple terminals T1 and T2 of Cx to $V_L$ or $V_H$. During phase 3, the voltage accumulated on Cint is sampled by sample and hold capacitor Csh (process block 725, phase 3). In the illustrated embodiment, Cint voltage is sampled by close circuiting sample switch S8 in response to control signal Phi3 to connect terminal T1 of Cint to Csh. In one embodiment, Csh has a substantially smaller capacitance than Cint (e.g., Cint≅22 nF and Csh≅10 pF). Upon completion of phase 3, switches S7 and S8 are open circuited.

The voltage sampled and held on Csh represents analog signal 220, which is indicative or representative of the capacitance Cx. Accordingly, in a process block 730, conversion unit 210 converts the analog signal 220 to digital code 225 that is indicative or representative of the capacitance of Cx and generates the feedback signal FB depending on conversion block internal operational stages.

Finally, in a process block 740 (phase 4), integrating capacitor Cint is reverse coupled (e.g., polarity reversed) to sensing capacitor Cx. In the illustrated embodiment, Cint is reverse coupled to Cx by close circuiting switch S4 to couple terminal T1 of Cx to terminal T2 of Cint and close circuiting switch S6 to couple terminal T1 of Cint to $V_H$ (or $V_L$ for negative charge transfer scheme). Reverse coupling Cx to Cint causes the noise accumulated on Cint during the charge transfer phase 2 to be cancelled from one cycle through process 700 to the next cycle, where a cycle includes a single repetition of phases 1, 2, 3, and 4.

In one embodiment, control circuit 310 is a counter circuit synchronized to CLK output from clock source 215. During operation, control circuit 310 generates control signals Phi1, Phi2, Phi3, and Phi4 to control the switching of switches S1 through S8. In one embodiment, control circuit 310 generates Phi1, Phi2, Phi3, and Phi4 as consecutive and repeating non-overlapping pulse signals.

Figure 8:
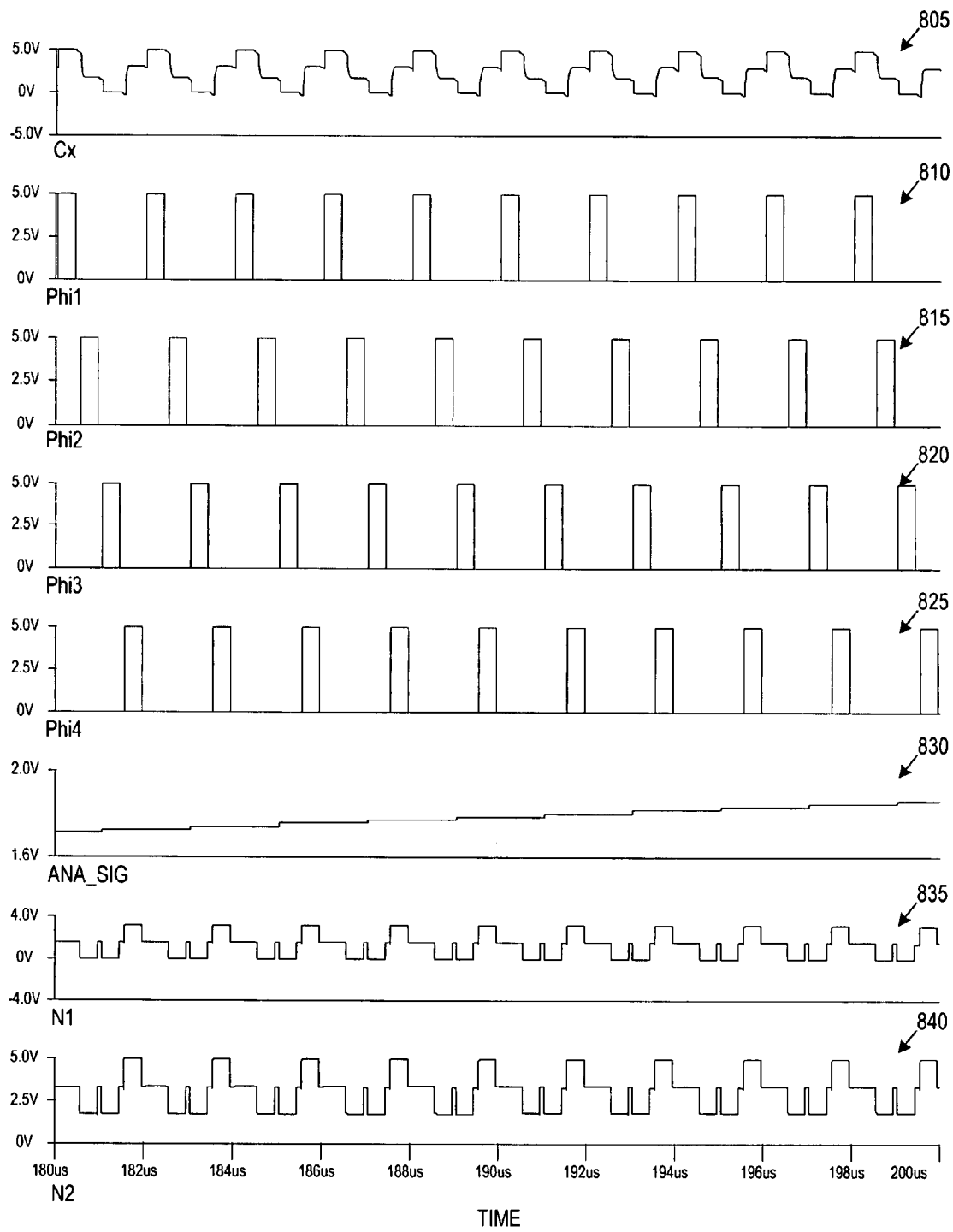
FIG. 8 includes time diagrams illustrating operation of a switch capacitor unit, in accordance with an embodiment of the invention.

FIG. 8 includes timing diagrams illustrating operation of switch capacitor unit 300 for the positive charge transfer scheme, in accordance with an embodiment of the invention. In particular, timing diagrams 810, 815, 820, and 825 illustrate the control signals Phi1, Phi2, Phi3, and Phi4, respectively. In the illustrated embodiment, Phi1, Phi2, Phi3, and Phi4 are non-overlapping pulse signals that repeat in order Phi1-Phi2-Phi3-Phi4-Phi1-Phi2-Phi3-Phi4 . . . . Timing diagram 830 illustrated the voltage on Cint (as represented by analog signal 220) ramps with each cycle. Since Csh samples Cint during phase 3 (Phi3 logic high), the voltage of analog signal 220 ramps on each pulse of Phi3. Timing diagrams 805, 835, and 840 illustrate the voltage on Cx, node N1, and node N2, respectively. For timing diagrams 805 through 840, feedback signal FB is logic low and the switch S9 is open circuited.

Figure 9A:
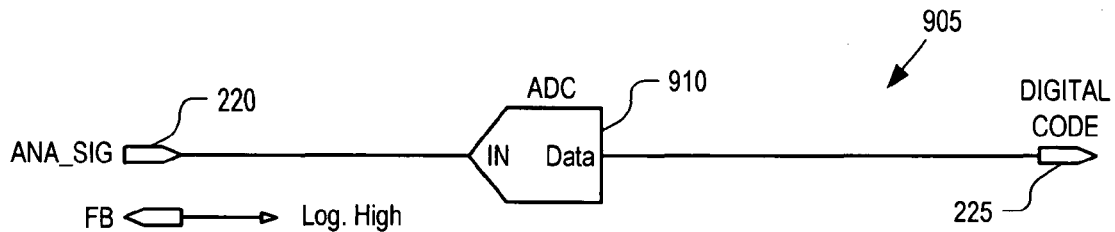
FIG. 9A is a block diagram illustrating a conversion unit of a capacitive sensor, in accordance with an embodiment of the invention.

FIGS. 9A-D are block diagrams illustrating various embodiments of conversion unit 225. FIG. 9A illustrates a conversion unit 905 including an analog to digital converter ("ADC") 910 and the feedback signal FB permanently pulled to a high logic value. Setting the feedback signal FB high all the time couples resistor R1 to Cint permanently. In this mode, switch capacitor unit 300 operates as a capacitance to voltage conversion unit 905 and the voltage of analog signal 220 is simply measured using ADC 910.

Figure 9B:
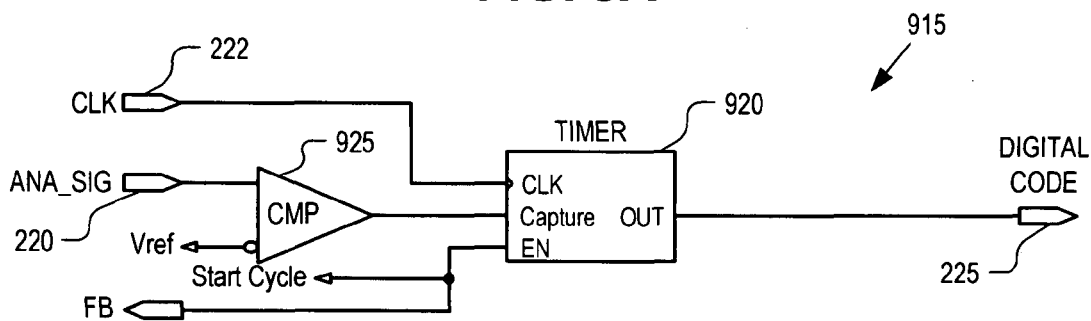
FIG. 9B is a block diagram illustrating a conversion unit of a capacitive sensor, in accordance with an embodiment of the invention.

FIG. 9B illustrates a conversion unit 915 including a timer circuit 920 and an analog comparator 925. Conversion unit 915 operates using a cycle-domain mode. During operation, Cint is reset before a measurement cycle by setting the feedback signal FB high for a finite period of time. The capacitance of Cx is measured as the number of cycle counts required to charge Cint to a threshold voltage set by Vref coupled to comparator 925.

Figure 9C:
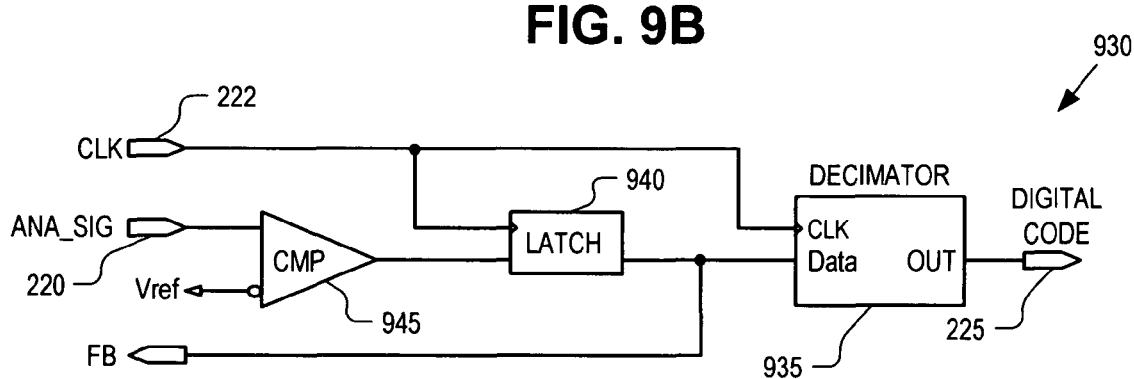
FIG. 9C is a block diagram illustrating a conversion unit of a capacitive sensor, in accordance with an embodiment of the invention.

FIG. 9C illustrates a conversion unit 930 including a sigma-delta modulator circuit with decimator circuit 935. The first order sigma-delta modulator is formed by a latch 940, and an analog comparator 945. During operation, voltage on Cint continuously dithers back and forth about Vref generating a bitstream at the output of latch 940. The sigma-delta modulator duty cycle is proportional to the sensing capacitance Cx. This square wave signal is filtered by the decimator circuit 935 and the percentage of time the square wave is high (e.g., logic '1') versus low (e.g., logic '0') (e.g., duty cycle) analyzed using a decimator digital filter. This percentage averaged over time is representative of the capacitance Cx. The decimator converts the modulator single bit digital stream into readable digital values. At a high level, a decimator is counter with an enable input. In this case, the counter preserves a current value when the comparator output is low and increments by one at a high comparator state. The counter code change between two conversions is directly proportional to the modulator bitstream density. In another embodiment the decimator is a sync$^2$ digital filter, which consists of a double integrator (operates at modulator clock rate) and double differentiator (operates at sample rate). Other digital filter implementations are possible for decimator 935 as well.

Figure 9D:
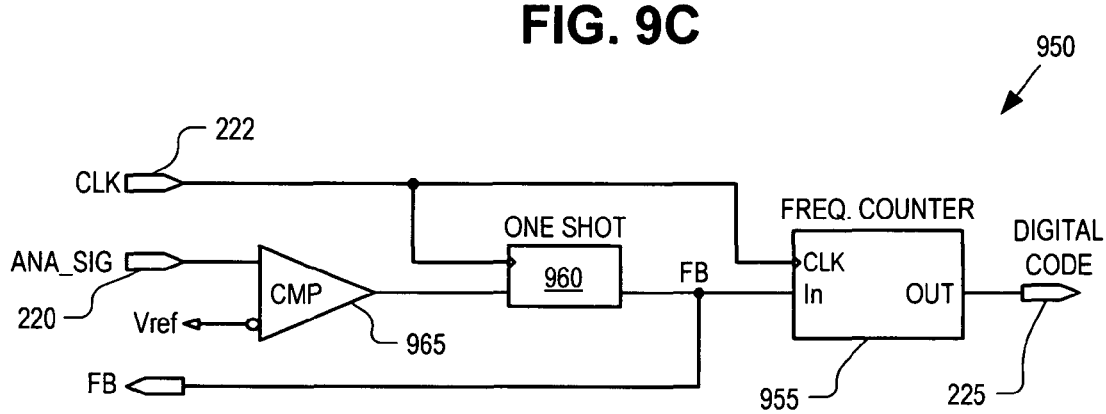
FIG. 9D is a block diagram illustrating a conversion unit of a capacitive sensor, in accordance with an embodiment of the invention.

FIG. 9D illustrates a conversion unit 950 including a frequency counter circuit 955, a one shot circuit 960, and an analog comparator 965. Conversion unit 950 operates by converting the measurement of the capacitance of Cx into the measurement of the frequency or period of the feedback signal FB output from one shot circuit 960. One shot circuit 960 is a monostable multivibrator circuit that generates FB having a variable period between fixed length pulses. The variable period is modulated in response to the capacitance of Cx. During operation, the voltage of analog signal 220 dithers back and forth about Vref, causing the output of comparator 965 to continuously toggle. The output of comparator 965 is coupled to the enable port of one shot circuit 960 to selectively enable or disable one shot circuit 960, thereby modulating the length of the variable period between the fixed length pulses. Subsequently, frequency counter 955 measures the frequency or period of the feedback signal FB to determine the capacitance Cx.

The conversion unit embodiments, illustrated by FIG. 9C and FIG. 9D maintain the voltage on integrating capacitor Cint close to reference voltage Vref. Setting reference voltage Vref equal to approximately half of $V_H$ provides a symmetric operational circuit, which improved ESD event suppression characteristics due to the symmetric ESD-pulse induced integrator capacitor current shape.

Figure 10:
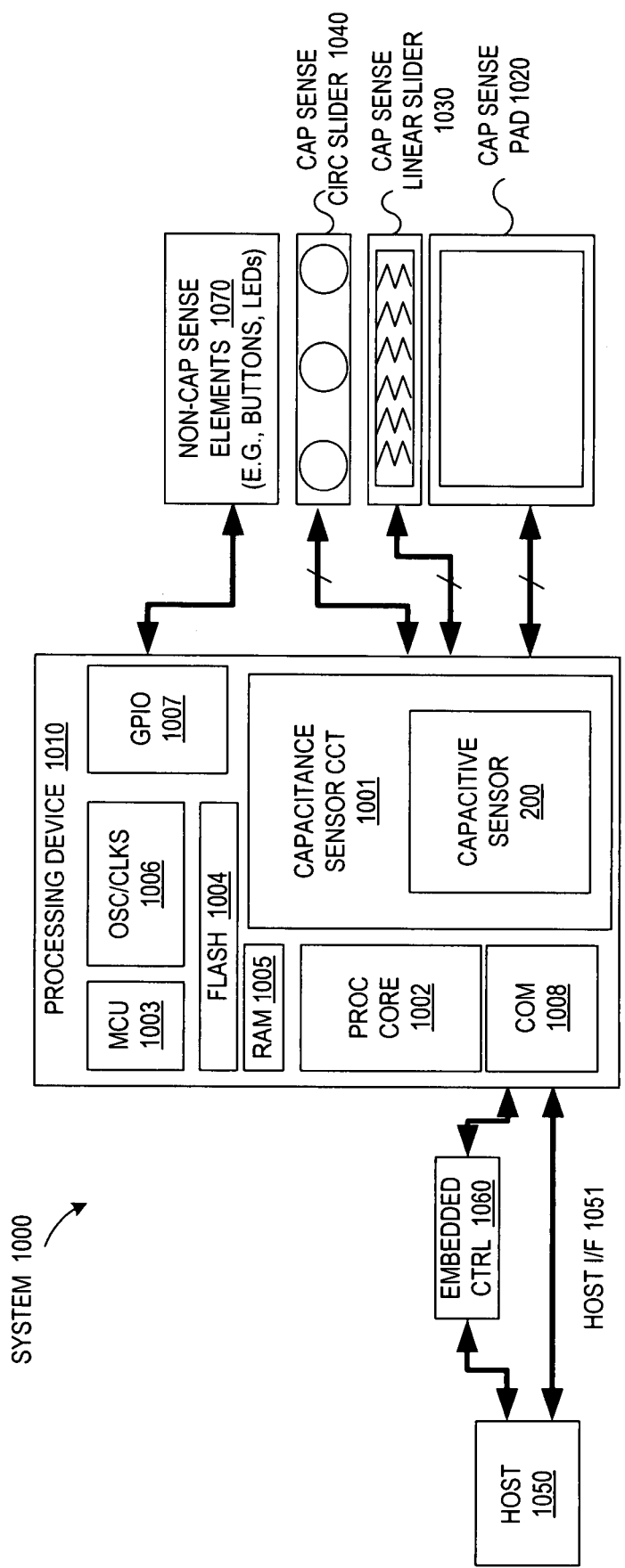
FIG. 10 is a functional block diagram illustrating a demonstrative processing system for implementing a capacitive sense user interface, in accordance with an embodiment of the invention.

FIG. 10 is a functional block diagram illustrating a demonstrative system 1000 for implementing a capacitance sense user interface, in accordance with an embodiment of the invention. The illustrated embodiment of system 1000 includes a processing device 1010, a capacitive sense pad 1020, a capacitive sense linear slider 1030, a capacitive sense radial slider 1040, a host processor 1050, an embedded controller 1060, and non-capacitance sensor elements 1070. Processing device 1010 may include analog and/or digital general purpose input/output ("GPIO") ports 1007. GPIO ports 1007 may be programmable. GPIO ports 1007 may be coupled to a Programmable Interconnect and Logic ("PIL"), which acts as an interconnect between GPIO ports 1007 and a digital block array of processing device 1010 (not illustrated). The digital block array may be configured to implement a variety of digital logic circuits (e.g., DAC, digital filters, digital control systems, etc.) using, in one embodiment, configurable user modules ("UMs"). The digital block array may be coupled to a system bus. Processing device 1010 may also include memory, such as random access memory (RAM) 1005 and program flash 1004. RAM 1005 may be static RAM ("SRAM"), and program flash 1004 may be a non-volatile storage, which may be used to store firmware. Processing device 1010 may also include a memory controller unit ("MCU") 1003 coupled to memory and the processing core 1002.

Processing device 1010 may also include an analog block array (not illustrated). The analog block array is also coupled to the system bus. The analog block array also may be configured to implement a variety of analog circuits (e.g., ADC, analog filters, etc.) using, in one embodiment, configurable UMs. The analog block array may also be coupled to the GPIO 1007.

As illustrated, capacitance sensor 1001, which includes an implementation of capacitive sensor 200, may be integrated into processing device 1010. Capacitance sensor 1001 may include analog I/O for coupling to an external component, such as capacitive sense pad 1020, capacitive sense linear slider 1030, capacitive sense radial slider 1040, and/or other capacitive sense devices. Note, capacitive sense pad 1020, capacitive sense linear slider 1030, and capacitive sense radial slider 1040 may each include one or more sensing capacitors Cx to implement the individual capacitive sense buttons therein.

Processing device 1010 may include internal oscillator/clocks 1006 and communication block 1008. The oscillator/clocks block 1006 provides clock signals to one or more of the components of processing device 1010. Communication block 1008 may be used to communicate with an external component, such as a host processor 1050, via host interface (I/F) line 1051. Alternatively, processing device 1010 may also be coupled to embedded controller 1060 to communicate with the external components, such as host 1050. Interfacing to the host 1050 can be through various methods. In one exemplary embodiment, interfacing with the host 1050 may be done using a standard PS/2 interface to connect to embedded controller 1060, which in turn sends data to the host 1050 via low pin count (LPC) interface. In some instances, it may be beneficial for processing device 1010 to do both touch-sensor pad and keyboard control operations, thereby freeing up the embedded controller 1060 for other housekeeping functions. In another exemplary embodiment, interfacing may be done using a universal serial bus (USB) interface directly coupled to host 1050 via host interface line 1051. Alternatively, processing device 1010 may communicate to external components, such as host 1050 using industry standard interfaces, such as USB, PS/2, inter-integrated circuit (I2C) bus, or system packet interfaces (SPI). Host 1050 and/or embedded controller 1060 may be coupled to processing device 1010 with a ribbon or flex cable from an assembly, which houses the sensing device and processing device.

In one embodiment, processing device 1010 is configured to communicate with embedded controller 1060 or host 1050 to send and/or receive data. The data may be a command or alternatively a signal. In an exemplary embodiment, system 1000 may operate in both standard-mouse compatible and enhanced modes. The standard-mouse compatible mode utilizes the HID class drivers already built into the Operating System (OS) software of host 1050. These drivers enable processing device 1110 and sensing device to operate as a standard cursor control user interface device, such as a two-button PS/2 mouse. The enhanced mode may enable additional features such as scrolling (reporting absolute position) or disabling the sensing device, such as when a mouse is plugged into the notebook. Alternatively, processing device 1010 may be configured to communicate with embedded controller 1060 or host 1050, using non-OS drivers, such as dedicated touch-sensor pad drivers, or other drivers known by those of ordinary skill in the art.

Processing device 1010 may reside on a common carrier substrate such as, for example, an integrated circuit (IC) die substrate, a multi-chip module substrate, or the like. Alternatively, the components of processing device 1010 may be one or more separate integrated circuits and/or discrete components. In one exemplary embodiment, processing device 1010 may be a Programmable System on a Chip (PSoC™) processing device, manufactured by Cypress Semiconductor Corporation, San Jose, Calif. Alternatively, processing device 1010 may be one or more other processing devices known by those of ordinary skill in the art, such as a microprocessor or central processing unit, a controller, special-purpose processor, digital signal processor ("DSP"), an application specific integrated circuit ("ASIC"), a field programmable gate array ("FPGA"), or the like. In an alternative embodiment, for example, processing device 1110 may be a network processor having multiple processors including a core unit and multiple microengines. Additionally, processing device 1010 may include any combination of general-purpose processing device(s) and special-purpose processing device(s).

Capacitance sensor 1001 may be integrated into the IC of processing device 1010, or alternatively, in a separate IC. Descriptions of capacitance sensor 1001 may be generated and compiled for incorporation into other integrated circuits. For example, behavioral level code describing capacitance sensor 1001, or portions thereof, may be generated using a hardware descriptive language, such as VHDL or Verilog, and stored to a machine-accessible medium (e.g., CD-ROM, hard disk, floppy disk, etc.). Furthermore, the behavioral level code can be compiled into register transfer level ("RTL") code, a netlist, or even a circuit layout and stored to a machine-accessible medium. The behavioral level code, the RTL code, the netlist, and the circuit layout all represent various levels of abstraction to describe capacitance sensor 1001.

In one embodiment, electronic system 1000 may be used in a notebook computer. Alternatively, system 1000 may be used in other applications, such as a mobile handset, a personal data assistant (PDA), a keyboard, a television, a remote control, a monitor, a handheld multi-media device, a handheld video player, a handheld gaming device, or a control panel.

The processes explained above are described in terms of computer software and hardware. The techniques described may constitute machine-executable instructions embodied within a machine (e.g., computer) readable medium, that when executed by a machine will cause the machine to perform the operations described. Additionally, the processes may be embodied within hardware, such as an application specific integrated circuit ("ASIC") or the like.

A machine-accessible medium includes any mechanism that provides (e.g., stores) information in a form accessible by a machine (e.g., a computer, network device, personal digital assistant, manufacturing tool, any device with a set of one or more processors, etc.). For example, a machine-accessible medium includes recordable/non-recordable media (e.g., read only memory (ROM), random access memory (RAM), magnetic disk storage media, optical storage media, flash memory devices, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An apparatus, comprising:
a plurality of switches; and
a controller coupled to the plurality of switches to configure the plurality of switches to:
couple a first terminal of a sensing capacitor to a first supply voltage and couple a second terminal of the sensing capacitor to a second supply voltage to charge the sensing capacitor;
couple the first terminal of the sensing capacitor to a first terminal of a second capacitor and couple the second terminal of the sensing capacitor and a second terminal of the second capacitor to the second supply voltage to transfer charge between the sensing capacitor and the second capacitor;
couple the first and second terminals of the sensing capacitor to the second supply voltage to discharge the sensing capacitor; and
couple the first terminal of the sensing capacitor to the second terminal of the second capacitor, couple the first terminal of the second capacitor to the first supply voltage, and couple the second terminal of the sensing capacitor to the second supply voltage to reverse couple the sensing capacitor to the second capacitor.

2. The apparatus of claim 1, wherein the plurality of switches comprises:
a charging switch coupled between the first supply voltage and a circuit node to selectively couple the sensing capacitor to the first supply voltage through the circuit node;
a charge transfer switch coupled between the circuit node and the first terminal of a second capacitor to selectively couple the sensing capacitor through the circuit node to the second capacitor;
a first switch coupled between the circuit node and a second terminal of the second capacitor to selectively couple the second terminal to the sensing capacitor through the circuit node; and
a second switch coupled between the first terminal of the second capacitor and the first supply voltage to selectively couple the first terminal to the first supply voltage.

3. The apparatus of claim 2, wherein the plurality of switches further comprises a discharging switch coupled between the circuit node and a second supply voltage to selectively discharge the sensing capacitor through the circuit node.

4. The apparatus of claim 3, wherein the plurality of switches further comprises a third switch coupled between the second terminal of the second capacitor and the second supply voltage to selectively couple the second terminal to the second supply voltage.

5. The apparatus of claim 4, further comprising:
a sample and hold capacitor; and
wherein the plurality of switches further comprises a fourth switch coupled between the sample and hold capacitor and the first terminal of the second capacitor to selectively couple the sample and hold capacitor to the second capacitor.

6. The apparatus of claim 5, wherein the plurality of switches further comprises a fifth switch coupled between the second terminal of the second capacitor and the second supply voltage to selectively couple the second terminal to the second supply voltage.

7. The apparatus of claim 6, wherein the controller is configured to generate first, second, third, and fourth output control signals, wherein the first output control signal is coupled to control the charging switch, wherein the second output control signal is coupled to control the charge transfer switch and the third switch, wherein the third output control signal is coupled to control the discharging switch, the fourth switch, and the fifth switch, and wherein the fourth output control signal is coupled to control the first and second switches.

8. The apparatus of claim 7, wherein the controller comprises a counter configured to enable the first, second, third, and fourth output control signals in four non-overlapping phases, respectively.

9. The apparatus of claim 5, further comprising:
a resistor; and
wherein the plurality of switches further comprises a reset switch coupled in series with the resistor, wherein the reset switch is couple to selectively couple the first and second terminals of the second capacitor together through the resistor.

10. The apparatus of claim 5, further comprising a current source coupled to selectively discharge the second capacitor.

11. The apparatus of claim 4, further comprising:
a first resistor coupled between the first supply voltage and the first terminal of the second capacitor; and
a second resistor coupled between the second supply voltage and the second terminal of the second capacitor.

12. The apparatus of claim 4, wherein the sensing capacitor comprises one of a plurality of sensing capacitors within a capacitive sense user interface and externally coupled to the circuit node via an input/output port, and wherein the second capacitor is larger than the sensing capacitor.

13. A method of operating a capacitive sensor, comprising:
charging a sensing capacitor during a first phase, wherein charging the sensing capacitor includes coupling a first terminal of the sensing capacitor to a first supply voltage and coupling a second terminal of the sensing capacitor to a second supply voltage;

transferring charge between the sensing capacitor and an integrating capacitor during a second phase, wherein transferring charge between the sensing capacitor and the integrating capacitor includes coupling the first terminal of the sensing capacitor to a first terminal of the integrating capacitor and coupling the second terminal of the sensing capacitor and a second terminal of the integrating capacitor to the second supply voltage;

discharging the sensing capacitor during a third phase, wherein discharging the sensing capacitor includes coupling the first and second terminals of the sensing capacitor to the second supply voltage; and reverse coupling the sensing capacitor to the integrating capacitor during a fourth phase, wherein reverse coupling the sensing capacitor to the integrating capacitor includes coupling the first terminal of the sensing capacitor to the second terminal of the integrating capacitor, coupling the first terminal of the integrating capacitor to the first supply voltage, and coupling the second terminal of the sensing capacitor to the second supply voltage.

14. The method of claim 13, wherein the first, second, third, and fourth phases comprise a cycle, the method further comprising:
repeating the cycle; and
sampling the integrating capacitor at least once for each cycle.

15. The method of claim 14, wherein reverse coupling the sensing capacitor to the integrating capacitor during the fourth phase comprises cancelling noise accumulated on the integrating capacitor between cycles.

16. The method of claim 14, wherein sampling the integrating capacitor comprises sampling the integrating capacitor during the third phase.

17. The method of claim 14, wherein sampling the integrating capacitor comprises sampling the integrating capacitor to generate an analog signal indicative of a capacitance of the sensing capacitor or a capacitance change in the sensing capacitor, the method further comprising:
converting the analog signal to a digital code.

18. The method of claim 17, wherein the sensing capacitor is included within a capacitive sense user interface, the method further comprising:
determining whether a user has actuated the sensing capacitor based on the digital code.

19. The method of claim 13, wherein the first, second, third, and fourth phases are non-overlapping phases.

20. The method of claim 13, further comprising initializing the capacitive sensor by discharging the integrating capacitor.

21. A system, comprising:
a conversion unit coupled to receive an analog signal and to converter the analog signal to a digital code; and
a switch capacitor unit to couple to a sensing capacitor to sense a capacitance or capacitance change of the sensing capacitor and to generate the analog signal indicative of the capacitance or capacitance change of the sensing capacitor, the sensing capacitor including one of a plurality of sensing capacitors coupled to the switch capacitor unit to form a capacitive sense user interface, the switch capacitor unit including:
an integrating capacitor including first and second electrodes;
a first plurality of switches coupled to charge the sensing capacitor, to transfer charge from the sensing capacitor to the integrating capacitor by selectively coupling the first terminal of the integrating capacitor to the sensing capacitor, and to discharge the sensing capacitor; and
a second switch to selectively couple the second terminal of the integrating capacitor to the sensing capacitor.

22. The system of claim 21, further comprising a clock source to generate a clock signal, the clock source coupled to provide the clock signal to the switch capacitor unit and the conversion unit.

23. The system of claim 22, wherein the clock source comprises a spread spectrum clock source.

24. The system of claim 22, wherein the conversion unit comprises:
a comparator coupled to compare the analog signal to a reference voltage and to generate a comparator output signal; and
a timer circuit including a clock input coupled to receive the clock signal, a capture input coupled to receive the comparator output signal, and timer output to output the digital code.

25. The system of claim 22, wherein the conversion unit comprises:
a comparator coupled to compare the analog signal to a reference voltage and to generate a comparator output signal;
a latch circuit coupled to latch the comparator output signal in response to clock signal to a latch output; and
a decimator circuit including a clock input coupled to receive the clock signal, a data input coupled to the latch output, and a decimator output to output the digital code.

26. The system of claim 25, wherein the latch output is coupled back to the switch capacitor unit as a feedback signal to selectively reset the integrating capacitor in response to the feedback signal.

27. The system of claim 22, wherein the conversion unit comprises:
a comparator coupled to compare the analog signal to a reference voltage and to generate a comparator output signal;
a one shot circuit coupled to generate a pulse signal in response to clock signal and the comparator output signal; and
a counter circuit including a clock input coupled to receive the clock signal, a counter input coupled to receive the pulse signal, and a counter output to output the digital code.

28. The system of claim 27, wherein the pulse signal output by the one shot circuit is coupled back to the switch capacitor unit as a feedback signal to selectively reset the integrating capacitor in response to the feedback signal.

29. The system of claim 22, wherein the switch capacitor unit further comprises:
a third switch coupled between a first electrode of the integrating capacitor a high supply voltage to selectively couple the first electrode to the high supply voltage;
a fourth switch coupled between the second electrode of the integrating capacitor and a low supply voltage to selectively couple the second electrode to the low supply voltage;
a sample and hold capacitor; and
a fifth switch coupled between the second electrode and the low supply voltage to selectively couple the second electrode to the low supply voltage.

30. The system of claim 29, wherein the switch capacitor unit further comprises a counter clocked by the clock signal to generate four control signals coupled to control switching of the first plurality of switches, the second switch, the third switch, the fourth switch, and the fifth switch.

31. The system of claim 21, wherein the conversion unit generates a feedback signal coupled to the switch capacitor unit, and wherein the switch capacitor unit is coupled to selectively reset the integrating capacitor in response to the feedback signal.

32. The system of claim 21, wherein the conversion unit comprises an analog to digital converter having an input coupled to receive the analog signal and an output coupled to generate the digital code.

* * * * *